United States Patent [19]

Nevill

[11] Patent Number: 5,754,559
[45] Date of Patent: May 19, 1998

[54] METHOD AND APPARATUS FOR TESTING INTEGRATED CIRCUITS

[75] Inventor: Leland R. Nevill, Boise, Id.

[73] Assignee: Micron Technology, Inc., Boise, Id.

[21] Appl. No.: 703,198

[22] Filed: Aug. 26, 1996

[51] Int. Cl.[6] .................................................. G01R 31/28
[52] U.S. Cl. ........................... 371/22.1; 395/183.01
[58] Field of Search ....................... 371/22.1, 22.5,
371/22.6, 25.1, 27.5; 324/765, 76.11; 395/183.06,
183.21, 183.13, 183.08, 183.01; 364/550,
481, 718, 769

[56] References Cited

U.S. PATENT DOCUMENTS

| | | | |
|---|---|---|---|
| 4,906,862 | 3/1990 | Itano et al. | 307/296.3 |
| 5,019,772 | 5/1991 | Dreibelbis et al. | 324/158 |
| 5,155,704 | 10/1992 | Walther et al. | 365/201 |
| 5,212,442 | 5/1993 | O'Toole et al. | 324/158 R |
| 5,231,605 | 7/1993 | Lee | 365/201 |
| 5,245,577 | 9/1993 | Duesman et al. | 365/201 |
| 5,248,075 | 9/1993 | Young et al. | 228/5.1 |
| 5,279,975 | 1/1994 | Devereaux et al. | 437/8 |
| 5,339,320 | 8/1994 | Fandrich et al. | 371/22.1 |
| 5,348,164 | 9/1994 | Heppler | 209/573 |
| 5,367,263 | 11/1994 | Ueda et al. | 324/537 |
| 5,373,472 | 12/1994 | Ohsawa | 365/201 |
| 5,384,533 | 1/1995 | Tokuda et al. | 324/158.1 |
| 5,384,741 | 1/1995 | Haragucyhi | 365/201 |
| 5,391,892 | 2/1995 | Devereaux et al. | 257/48 |
| 5,397,908 | 3/1995 | Dennison et al. | 257/306 |
| 5,420,869 | 5/1995 | Hatakeyama | 371/21.1 |
| 5,426,649 | 6/1995 | Blecha | 371/22.1 |
| 5,440,241 | 8/1995 | King et al. | 324/765 |
| 5,440,517 | 8/1995 | Morgan et al. | 365/202 |
| 5,442,642 | 8/1995 | Ingalla et al. | 371/22.5 |
| 5,450,362 | 9/1995 | Matsuzaki | 365/201 |
| 5,452,253 | 9/1995 | Choi | 365/201 |
| 5,457,400 | 10/1995 | Ahmad et al. | 324/763 |
| 5,467,468 | 11/1995 | Koshikawa | 371/22.3 |
| 5,469,393 | 11/1995 | Thomann | 365/201 |
| 5,475,330 | 12/1995 | Watanabe et al. | 327/408 |
| 5,488,583 | 1/1996 | Ong et al. | 365/201 |
| 5,526,364 | 6/1996 | Roohparvar | 371/22.1 |
| 5,528,162 | 6/1996 | Sato | 324/65 |
| 5,528,603 | 6/1996 | Canella et al. | 371/25.1 |
| 5,541,935 | 7/1996 | Waterson | 371/22.5 |
| 5,544,108 | 8/1996 | Thomann | 365/201 |

Primary Examiner—Robert W. Beausoliel, Jr.
Assistant Examiner—Nadeem Iqbal
Attorney, Agent, or Firm—Schwegman, Lundberg, Woessner & Kluth, P.A.

[57] ABSTRACT

A test system for use with an automatic testing equipment to test a large number of integrated circuits simultaneously. The test system comprises a plurality of logical circuits for simultaneously combining the signals from like output lines of the integrated circuits being tested. The logical circuits substantially reduce the number of the signals and therefore remove the limitation of the number of the input/output channels on the automatic testing equipment and allows the simultaneously testing of a large number of integrated circuits.

21 Claims, 4 Drawing Sheets

5,754,559

1

METHOD AND APPARATUS FOR TESTING INTEGRATED CIRCUITS

THE FIELD OF THE INVENTION

The present invention relates generally to integrated circuits and, in particular, to a circuit and method for testing a large number of integrated circuits simultaneously.

BACKGROUND OF THE INVENTION

An integrated circuit comprises a large number of semiconductor devices, such as transistors, which are interconnected together and usually fabricated on a semiconductor substrate. During the manufacturing of integrated circuits or semiconductor devices, it is required to test the devices to ensure they meet published performance specifications. In a typical manufacturing process, the testing is performed on automatic testing equipment (ATE) at several points during the process and at several temperatures. It has long been desired to test as many devices as possible simultaneously on one piece of ATE to reduce the capital cost. One of the limiting factors in testing a large number of devices at once is the number of channels required to read the output lines of the devices under test.

A typical integrated circuit contains at least one and as many as 64 or more data output lines. To test a large number of integrated circuits simultaneously required an ATE comprising a large number of input/output (I/O) channels to read the output lines of the devices under test. This requires a costly ATE system and consequently, the cost of the integrated circuits increases.

For the reason stated above, and for the other reasons stated below which will become more apparent to those skilled in the art upon reading and understanding the present invention, there is a need in the art for an economical method of testing a large number of integrated circuits simultaneously.

SUMMARY OF THE INVENTION

The present invention describes a circuit and method to test a large number of integrated circuits (ICs) simultaneously. The main advantage of this invention is that it allows testing a large number of ICs without depending on the limitation of the number of channels on the ATE system. This greatly reduces the cost of the ATE system and therefore the cost of the ICs being tested.

In particular, the present invention describes a test system comprising a testing platform for receiving signals from the output lines of a plurality of ICs. The ICs comprises a plurality of sets of like output lines including a first and a second to an Nth sets of like output lines. The test system also comprises a combining circuitry designed for receiving and combining the signals from the output lines of the ICs through the testing platform. The combining method substantially reduces the number of the signals of the ICs before they enter the ATE. The combining circuitry comprises a plurality of logical circuits. Each logical circuit simultaneously receives the signals from each of the sets of like output lines of the ICs and combines the signals into a single combined signal. The combined signal from each of the logical circuits is input into the ATE for testing evaluation.

In one embodiment, the combining circuitry comprises an N number of logical circuits including a first, a second, . . . , and an Nth logical circuit, where N equals at least one. Each of the N logical circuits comprises a plurality of logic gates. The first logical circuit logically combines the signals from

2 the first set of like output lines of the ICs into a first combined signal. Likewise, the second to the Nth logical circuits, functioning in the same method, respectively combine the signals from the second to the Nth sets of like output lines of the ICs into a second to the Nth combined signals.

Each of the combined signals has a value of either a logic "zero" or a logic "one". If the signals from the like output lines are the same, then the combined signal has a logic "zero" and no error signal is generated. If any of the signals from the like output lines is different from the other, then the combined signal has a logic "one" and an error signal is generated. In this case further testing can be conducted by the ATE to determine which IC contains the defective output line.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is therefore, not to be taken in limiting sense, and the scope of the invention is defined by the appended claims.

Figure 1:
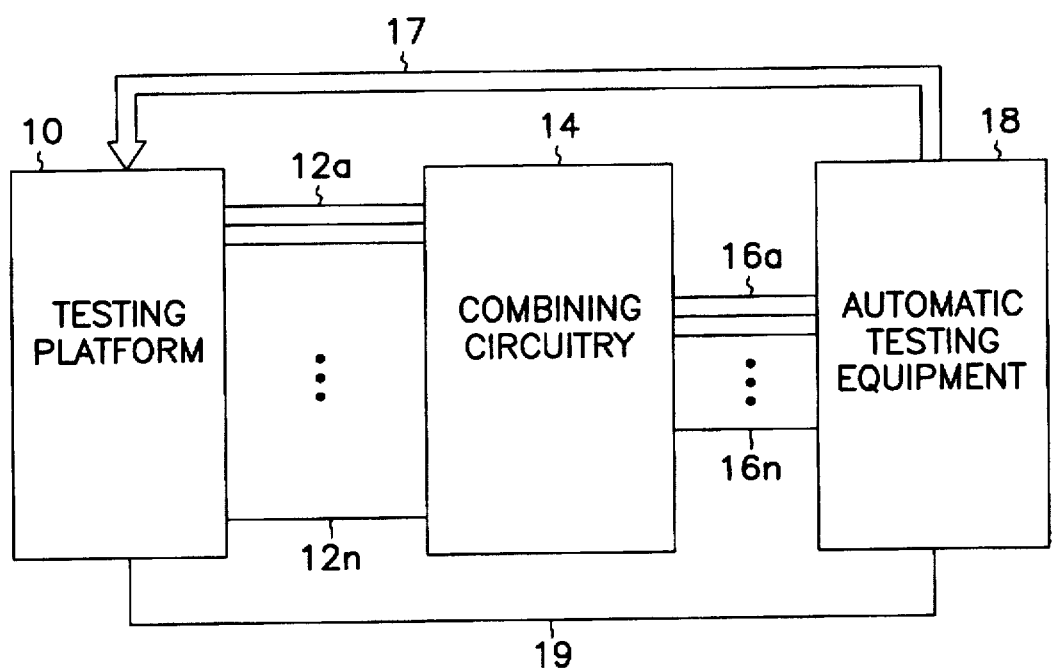
FIG. 1 is a block diagram of a test system of the present invention.

FIG. 1 is a block diagram of a test system of the present invention. The test system comprises a testing platform 10 for receiving signals from a plurality of integrated circuits. A combining circuitry 14 is used to receive and combine the signals from testing platform 10 through a plurality of signal lines 12a–12n. An automatic testing equipment 18 is coupled to combining circuitry 14 to receive combined signals produced by combining circuitry 14. An interface comprises signal lines 16a–16n for passing the combined signals to ATE 18. ATE 18 also provides input/control signals to the integrated circuits through signal lines 17. In addition, testing platform 10 receives a test mode signal from ATE 18 through signal line 19

Figure 2:
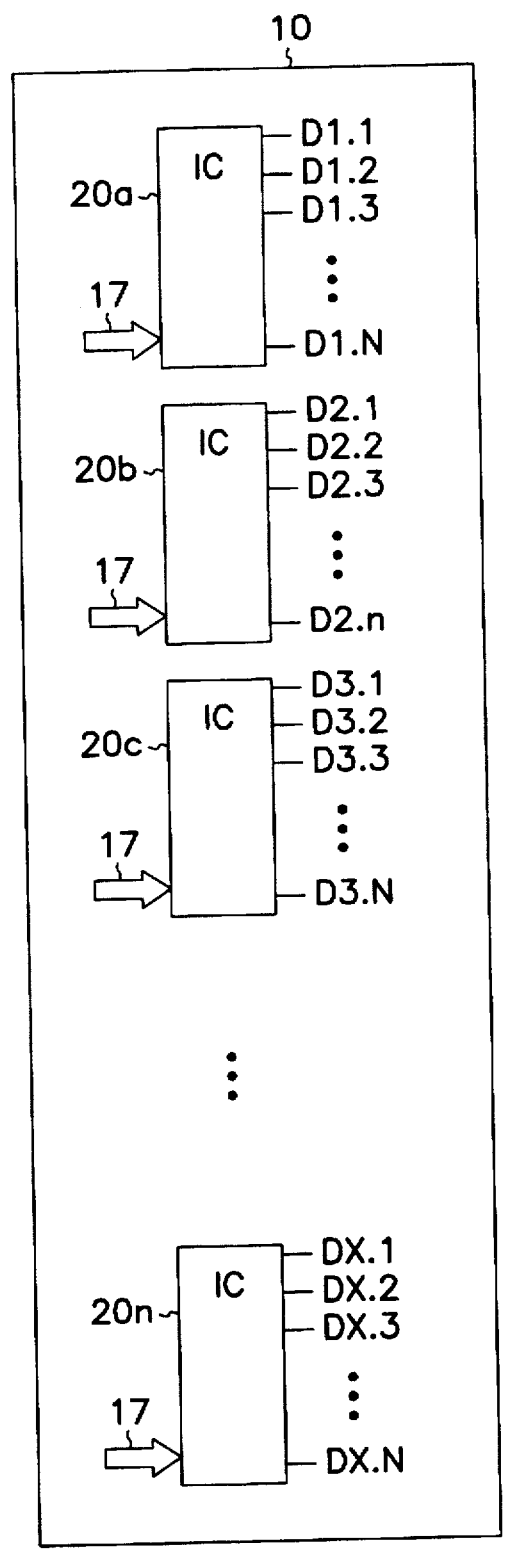
FIG. 2 is a block diagram of a testing platform of the test system of FIG. 1.

FIG. 2 is a block diagram of testing platform 10 of the test system of FIG. 1. Testing platform 10 comprises an X number of ICs, including a first IC 20a, a second IC 20b, a third IC 20c, . . . , and an Xth IC 20n, where X is greater than one. Each of the ICs comprises an N number of output lines, where N equals to at least one. The N output lines of each of the ICs are indicated alphanumerically. For example, a first, a second, a third, . . . , and an Nth output lines of first IC 20a are indicated as D1.1, D1.2, D1.3, . . . , and D1.N respectively. Similarly, the N output lines of the Xth IC are indicated as DX.1, DX.2, DX.3, . . . , and DX.N. It is to be understood that the first set of like output lines of ICs 20a–20n are D1.1, D2.1, D3.1, . . . . , DX.1. Likewise, the second set of like output lines of ICs 20a–20n are D1.2, D2.2, D3.2, . . . . . DX.2. And the Nth set of like output lines of ICs 20a–20n are D1.N, D2.N, D3.N, . . . , DX.N. In addition, ICs 20a–20n receive input/control signals from ATE 18 through signals lines 17 to produce a plurality of outputs at D1.1-DX.N.

Figure 3:
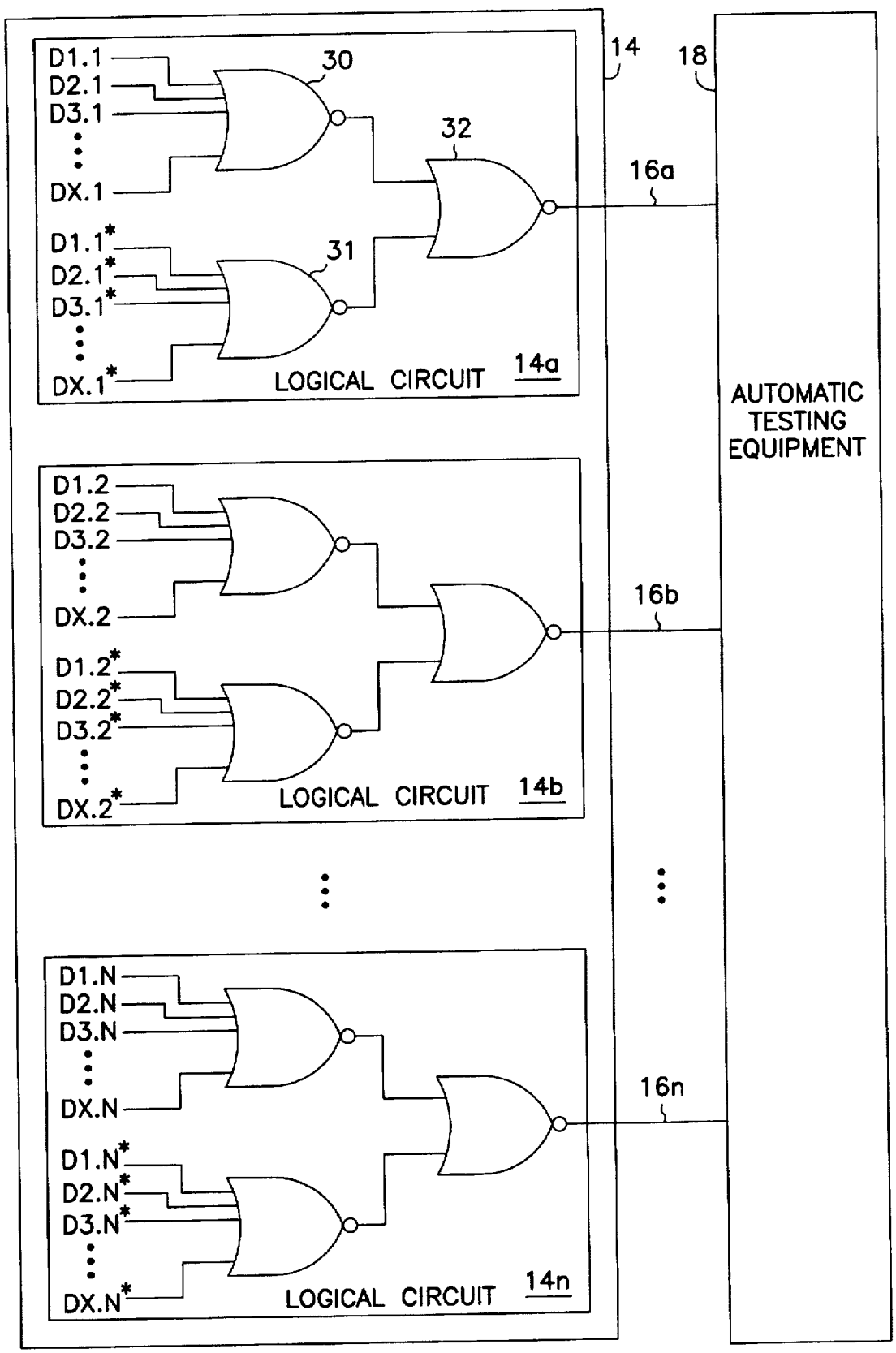
FIG. 3 is a block diagram of a combining circuitry coupled to an ATE of the test system of FIG. 1.

FIG. 3 is a block diagram of combining circuitry 14 coupled to ATE 18 of the test system of FIG. 1. Combining circuitry 14 comprises a plurality of logical circuits, including a first logical circuit 14a, a second logical circuit 14b, . . . , and an Nth logical circuit 14n. Each of the logical circuits comprises a plurality of logic gates. Logical circuit 14a includes a first NOR gate 30, a second NOR gate 31, and a third NOR gate 32. The inputs of NOR gate 30 are the signals from the first set of like output lines, D1.1-DX.1. The inputs of NOR gate 31 are the compliments of each of the signals from the first set of like output lines, D1.1*-DX.1 *. The inputs of NOR gate 32 are the outputs of NOR gates 30 and 31. In a like fashion, logical circuits 14b–14n are logical constructed and functioning in the same method as logical circuit 14a.

Combining the output lines of the integrated circuits

Individual IC must be tested during manufacturing to insure that it meets designed specifications. In a typical testing process, ICs are tested in a large number simultaneously using an ATE. One of the limiting factors in testing a large number of ICs simultaneously is the number of I/O channels required to read the output lines of the ICs. This invention removes the channel limitation by logically comparing and combining all of the signals from like output lines of the ICs into one signal.

Referring to FIG. 1, testing platform 10 receives a test mode signal through signal line 19 from ATE 18 to start the test. Testing platform 10 also receives other input/control signals such as clocks, address, write enables, outputs enables signals, etc. The integrated circuits respond to these input/control signals to produce a plurality of output signals 12a–12n. Combining circuitry 14 logically combines the output signals, 12a–12n, to produce a substantially smaller number of N signals, 16a–16n. N signals 16a–16n, are then input into ATE 18 for testing evaluation.

Referring to FIGS. 2–3, the combining method is performed by logical circuits 14a–14n. Logical circuit 14a receives the signals and their compliments from the first set of like output lines, D1.1, D2.1, . . . , DX.1, and combines them into one signal, 16a, which is used as an input to ATE 18. Logical circuit 14a logically functions in a way such that if all of the signals from the first set of like output lines are the same, then no error signal is generated, and signal 16a has a logic "zero". If any of the signals is different from the other, then an error signal will be generated, and signal 16a has a logic "one". In a like fashion, logical circuits 14b–14n operate in the same method as logical circuit 14a. Signals from the second to the Nth set of like output lines of ICs 20a–20n are logically combined into signals 16b–16n. If the logical circuits generate an error signal, then further testing can be conducted by ATE 18 to determine which IC contains the defective output line.

Locating the defective output line can be determined by conventional methods. For example, when an error signal is generated during the testing process, the content of the set of signals having the error can be saved to a memory such as a First In First Out (FIFO) memory. The set is then retrieved and analyzed to determine the exact location of the defective output line.

Figure 4:
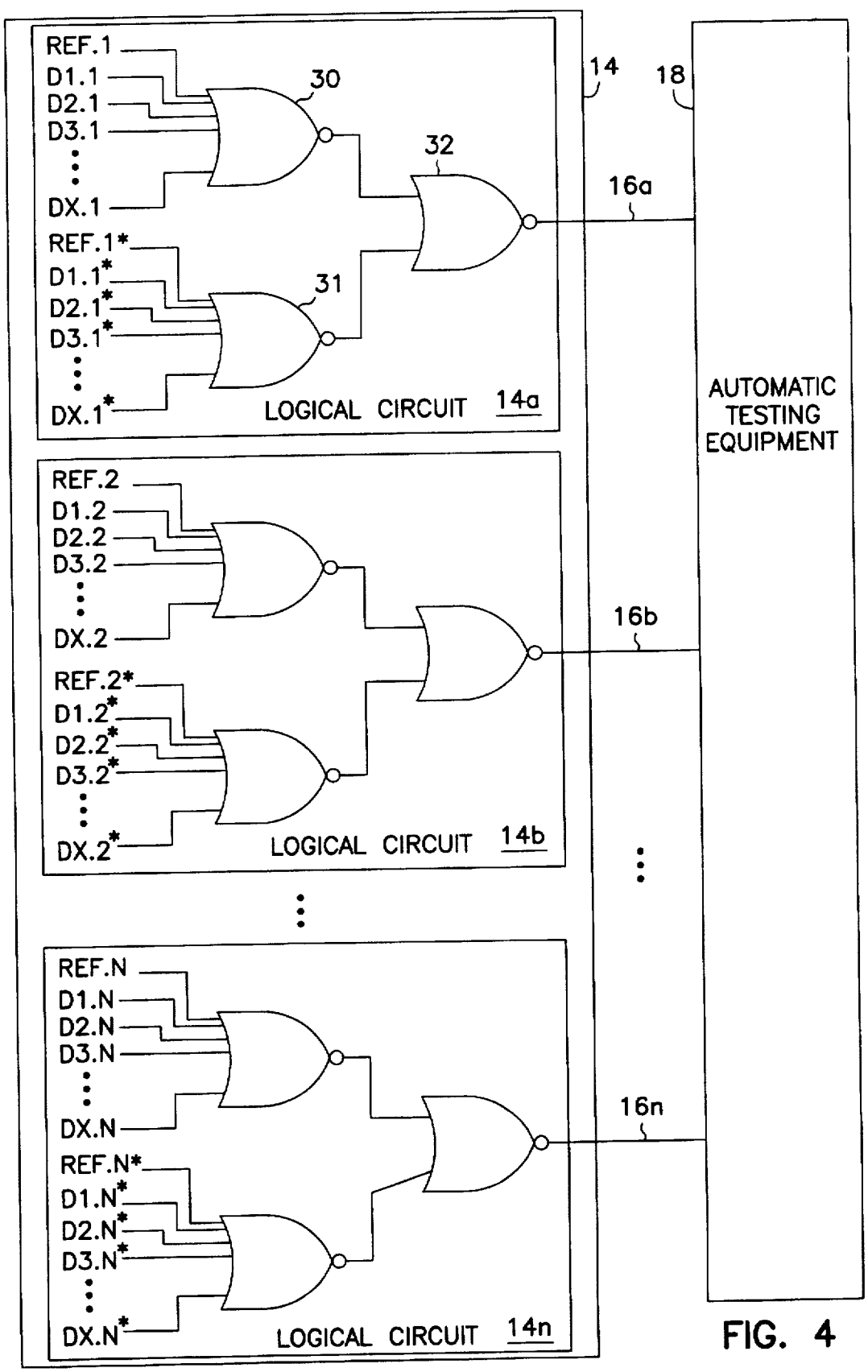
FIG. 4 is a block diagram of an alternative embodiment of the combining circuitry coupled to an ATE of the test system of FIG. 1.

In another embodiment, ATE 18 provides a reference signal and its compliment to each of logical circuits 14a–14n, indicated as REF. 1, REF.1*, . . . , REF.N, REF.N*, as shown in FIG. 4.

Conclusion

A test system described herein includes a plurality of logical circuits for combining and substantially reducing signals from the output lines of a large number of ICs being tested. The combined signals, when use in conjunction with an ATE, effectively offer an economical method of simultaneously performing the testing of the ICs.

Although specific embodiments have been illustrated and described herein for purposes of description of the preferred embodiments, it will be appreciated by those of ordinary skill in the art that a wide variety of alternate and/or equivalent implementations calculated to achieve the same purposes may be substituted for the specific embodiments shown and described without departing from the scope of the present invention. For example, the combining method of logical circuits 14a–14n can be achieved by using other embodiments constructed from the combinations of other logic gates such as AND, OR, NAND or XOR. Also, positive or negative logic conventions may be used where a logical one may be a higher or lower voltage than a logical zero. This application is intended to cover any adaptations or variations of the preferred embodiments discussed herein. Therefore, it is manifestly intended that this invention be limited only by the claims and the equivalents thereof.

What is claimed is:

1. A test system for simultaneously testing a plurality of integrated circuits with a single external automatic testing equipment, comprising:

a testing platform receiving output signals from identical output lines of the plurality of integrated circuits and providing identical input and control signals to identical input lines of the plurality of integrated circuits from the single automatic testing equipment;

a combining circuit in electrical communication with the testing platform and operable for receiving and logically combining the output signals from the identical output lines of the plurality of integrated circuits through the testing platform to produce logically combined signals; and an interface connected to the combining circuit and operable for communicating the logically combined signals to the automatic testing equipment.

2. The test system according to claim 1 wherein the combining circuit comprises a plurality of logical circuits.

3. The test system according to claim 2 wherein the logical circuits logically combine the output signals from the identical output lines of the integrated circuits to produce a substantially smaller number signals.

4. A test system for testing a plurality of substantially identical integrated circuits for use with a single external automatic testing equipment, comprising:

a testing platform receiving output signals from the functionally same output lines of the plurality of substantially identical integrated circuits and providing identical input and control signals to the functionally same input lines of the plurality of substantially identical integrated circuits from the single external automatic testing equipment;

a combining circuitry connected to the testing platform and operable for receiving and logically combining the signals from the output lines of the integrated circuits and for producing therefrom combined signals; and an interface to the single external automatic testing equipment and operable for passing the combined signals to the automatic testing equipment.

5. The test system according to claim 4 wherein the combining circuitry further includes a reference signal from the automatic testing equipment.

6. The test system according to claim 4 wherein the combining circuitry comprises a plurality of logical circuits.

7. The test system according to claim 6 wherein the logical circuits logically combine the output signals from the functionally same output lines of the plurality of substantially identical integrated circuits to produce a substantially smaller number of combined signals.

8. A test system for simultaneously testing a plurality of integrated circuits designed to be functionally identical, wherein the plurality of integrated circuits comprise a plurality of sets of like output lines each set including a first to an Nth of like output lines, where N is greater than one, comprising:

a testing platform for receiving output signals from the plurality of sets of like output lines of the integrated circuits designed to be functionally identical and providing identical input and control signals to the integrated circuits from a single external automatic testing equipment;

a combining circuitry for receiving and logically combining the output signals from each set of the like output lines of the integrated circuits through the testing platform to produce a plurality of logically combined output signals; and an indicator for indicating a failure in at least one of the plurality of integrated circuits when at least one of the plurality of logically combined output signals indicates at least one of the plurality of like output lines differs from others of the plurality of like output lines from any one set of the plurality of sets of like output lines.

9. The test system according to claim 8 wherein the combining circuitry comprises a plurality of logical circuits including a first, and a second to an Nth logical circuits, where N is greater than 2.

10. The test system according to claim 9 wherein the first logical circuit comprises a plurality of logic gates.

11. The test system according to claim 10 wherein the first logical circuit comprises a plurality of NOR gates including a first, a second and a third NOR gates.

12. The test system according to claim 10 wherein the inputs of the first NOR gate are the signals from the first set of like output lines of the integrated circuits.

13. The test system according to claim 10 wherein the inputs of the second NOR gate are the compliments of each of the signals of the first set of like output lines of the integrated circuits.

14. The test system according to claim 10 wherein the inputs of the third NOR gate are the outputs of the first and the second NOR gates.

15. The test system of claim 9 wherein each of the logical circuits is logically the same.

16. The test system of claim 9 wherein each of the logical circuits from the second to the Nth logical circuits operates in the same logic as the first logical circuit.

17. A method of testing multiple integrated circuits which are designed to be substantially identical for use with a single external automatic testing equipment, comprising the steps of:

loading a plurality of integrated circuits designed to be substantially identical onto a testing platform:

initiating a test mode in a single external automatic testing equipment;

providing identical input and control signals to identical pins on the integrated circuits from the single external automatic testing equipment;

receiving testing signals from a plurality of output lines of the plurality of integrated circuits;

simultaneously combining the testing signals from identical output lines from the plurality of output lines of the plurality of integrated circuits to produce logically combined signals; and providing the logically combined signals to the automatic testing equipment.

18. The method according to claim 17 wherein the step of simultaneously combining the testing signals from the identical output lines from the plurality of output lines of the plurality of integrated circuits is performed by a plurality of logical circuits.

19. The method according to claim 17 wherein the step of simultaneously combining the testing signals from the identical output lines includes the step of simultaneously combining the compliment of each of the signals from the identical output lines from the plurality of output lines of the integrated circuits.

20. The method according to claim 19 wherein the step of simultaneously combining the compliment of each of each of the signals from the identical output lines from the plurality of output lines of the plurality of integrated circuits is performed by a plurality of logical circuits.

21. The method according to claim 17 wherein the step of simultaneously combining the testing signals from the identical output lines from the plurality of output lines of the plurality of integrated circuits to produce logically combined signals is performed such that the number of the combined signals is substantially smaller than the testing signals.

* * * * *